(12) United States Patent
Vasylyev

(10) Patent No.: US 10,868,205 B2
(45) Date of Patent: Dec. 15, 2020

(54) LIGHT CONVERTING SYSTEM EMPLOYING PLANAR LIGHT TRAPPING AND LIGHT ABSORBING STRUCTURES

(71) Applicant: Sergiy Vasylyev, Elk Grove, CA (US)

(72) Inventor: Sergiy Vasylyev, Elk Grove, CA (US)

(73) Assignee: SW TECHNOLOGY INNOVATIONS, INC., Sacramento, CA (US)

( * ) Notice: Subject to any disclaimer, the term of this patent is extended or adjusted under 35 U.S.C. 154(b) by 0 days.

(21) Appl. No.: 16/585,550

(22) Filed: Sep. 27, 2019

(65) Prior Publication Data

US 2020/0028015 A1 Jan. 23, 2020

Related U.S. Application Data

(60) Division of application No. 16/368,272, filed on Mar. 28, 2019, now Pat. No. 10,439,089, which is a division of application No. 15/442,645, filed on Feb. 25, 2017, now Pat. No. 10,269,999, which is a continuation of application No. 14/222,588, filed on Mar. 22, 2014, now abandoned, which is a continuation of application No. 13/181,482, filed on Jul. 12, 2011, now Pat. No. 8,735,791.

(Continued)

(51) Int. Cl.
| | |
|---|---|
| *H01L 27/00* | (2006.01) |
| *H01L 31/054* | (2014.01) |
| *G01J 1/04* | (2006.01) |
| *G01J 5/08* | (2006.01) |
| *G02B 5/02* | (2006.01) |
| *H01L 31/0232* | (2014.01) |
| *H01L 31/0525* | (2014.01) |
| *G02B 19/00* | (2006.01) |

(52) U.S. Cl.
CPC ........ *H01L 31/0547* (2014.12); *G01J 1/0407* (2013.01); *G01J 5/0853* (2013.01); *G02B 5/0231* (2013.01); *G02B 5/0294* (2013.01); *G02B 19/0028* (2013.01); *H01L 31/02327* (2013.01); *H01L 31/0525* (2013.01); *H01L 31/0543* (2014.12); *Y02E 10/52* (2013.01)

(58) Field of Classification Search
CPC ........... H01L 31/0525; H01L 31/02327; H01L 31/0543; H01L 31/0547
USPC .......... 250/203.1, 203.3, 203.4, 216; 385/33, 385/36; 136/246, 256, 259
See application file for complete search history.

(56) References Cited

U.S. PATENT DOCUMENTS

| | | |
|---|---|---|
| 6,274,860 B1 | 8/2001 | Rosenberg |
| 6,333,458 B1 | 12/2001 | Forrest et al. |

(Continued)

*Primary Examiner* — Kevin K Pyo

(57) ABSTRACT

A light converting optical system employing a planar light trapping optical structure illuminated by a source of monochromatic light. The light trapping optical structure includes a photoresponsive layer including quantum dots. The photoresponsive layer is configured at a relatively low thickness and located between opposing broad-area reflective surfaces that confine and redistribute light within the light trapping structure, causing multiple transverse propagation of light through the photoresponsive layer and enhanced absorption and light conversion. The light trapping optical structure further incorporates optical elements located on a light path between the light source and the photoresponsive layer.

20 Claims, 7 Drawing Sheets

Related U.S. Application Data

(60) Provisional application No. 61/402,061, filed on Aug. 21, 2010, provisional application No. 61/399,552, filed on Jul. 13, 2010.

(56) References Cited

U.S. PATENT DOCUMENTS

| | | |
|---|---|---|
| 6,440,769 B2 | 8/2002 | Peumans et al. |
| 7,672,549 B2 | 3/2010 | Ghosh et al. |
| 7,817,885 B1 | 10/2010 | Moore et al. |
| 10,269,999 B2 | 4/2019 | Vasylyev |
| 2004/0103938 A1 | 6/2004 | Rider |
| 2008/0264483 A1 | 10/2008 | Keshner et al. |
| 2009/0067784 A1 | 3/2009 | Ghosh et al. |
| 2009/0126792 A1 | 5/2009 | Gruhlke et al. |
| 2010/0186798 A1 | 7/2010 | Tormen et al. |
| 2010/0278480 A1 | 11/2010 | Vasylyev |
| 2011/0226332 A1 | 9/2011 | Ford et al. |
| 2012/0012741 A1 | 1/2012 | Vasylyev |
| 2013/0028565 A1 | 1/2013 | Moore et al. |
| 2019/0207049 A1* | 7/2019 | Vasylyev .............. G01J 1/0407 |

\* cited by examiner

LIGHT CONVERTING SYSTEM EMPLOYING PLANAR LIGHT TRAPPING AND LIGHT ABSORBING STRUCTURES

CROSS-REFERENCE TO RELATED APPLICATIONS

This application is a division of application Ser. No. 16/368,272, filed Mar. 28, 2019, which is a division of application Ser. No. 15/442,645, filed Feb. 25, 2017, which is a continuation of application Ser. No. 14/222,588, filed Mar. 22, 2014, which is a continuation of application Ser. No. 13/181,482, filed Jul. 12, 2011, now U.S. Pat. No. 8,735,791, which claims priority from U.S. provisional application Ser. No. 61/399,552 filed on Jul. 13, 2010 and from U.S. provisional application Ser. No. 61/402,061 filed on Aug. 21, 2010, each of which is incorporated by reference herein in its entirety.

STATEMENT REGARDING FEDERALLY SPONSORED RESEARCH OR DEVELOPMENT

Not Applicable

INCORPORATION-BY-REFERENCE OF MATERIAL SUBMITTED ON A COMPACT DISC

Not Applicable

NOTICE OF MATERIAL SUBJECT TO COPYRIGHT PROTECTION

A portion of the material in this patent document is subject to copyright protection under the copyright laws of the United States and of other countries. The owner of the copyright rights has no objection to the facsimile reproduction by anyone of the patent document or the patent disclosure, as it appears in the United States Patent and Trademark Office publicly available file or records, but otherwise reserves all copyright rights whatsoever. The copyright owner does not hereby waive any of its rights to have this patent document maintained in secrecy, including without limitation its rights pursuant to 37 C.F.R. § 1.14.

BACKGROUND OF THE INVENTION

1. Field of the Invention

The present invention relates to a device and method for harvesting radiant energy emanated by a distant radiant energy source, particularly, to collecting the sunlight and absorbing it by a light sensitive material, medium or device. More particularly, the present invention relates to photovoltaic devices, solar cells and light detectors having light trapping microstructures or layers to improve absorption of light within the light sensitive layer, and to a method for generating electricity from sunlight thereof.

2. Description of Background Art

Conventionally, photovoltaic solar cells or light detectors employ an active photoresponsive layer that absorbs at least a portion of the electromagnetic spectrum of the light and generates charge carriers due to the photovoltaic effect. Since most photovoltaic materials absorb much more weakly in certain wavelengths than in the others, the active layer has to have at least a minimum thickness to be able to absorb most of the light to which the photovoltaic material is responsive.

One exemplary material suitable for converting light into electricity is silicon (Si). However, Si is an indirect bandgap semiconductor and is poorly absorbing the long wavelength light. For the active layer made with crystalline silicon the minimum thickness is typically between 200 and 400 μm (micro-meters). While Si is very abundant, stable and well-suited for solar cell and light detector manufacturing, the cost of this thick layer of silicon is quite high which results in the high cost of the devices.

Some other than crystalline silicon types of photovoltaic devices, such as amorphous silicon thin-film cells, for example, allow for a much smaller thickness of the active layer. However, with certain wavelengths being still absorbed very weakly, they usually require some form of light trapping that would cause the incident light to pass through the active layer multiple times thus improving the absorption. The light trapping is usually implemented in the prior art by texturing one or more surfaces comprising the solar cell in order to scatter the incident light at different angles thus resulting in a longer average light path through the active layer. In case of a monocrystalline silicon cell, light scattering and trapping is conventionally provided by microstructures such as periodic or random pyramids on the front surface and a reflective or light scattering surface at the rear of the cell. In case of an amorphous thin-film Si cell consisting of several layers, a transparent top conductor layer is often textured to scatter light and hence increase the light path through the active layer.

During light trapping, some scattered light can be trapped in the active layer of the solar photovoltaic device by means of TIR which can even allow for the multiple passage of a portion of solar rays through the active layer thus resulting in a better absorption and sunlight conversion. However, the existing approaches for light trapping in the photovoltaic devices cannot prevent for a substantial portion of incident light to escape from the device without being absorbed. For example, in case of the front surface employing random pyramidal microstructures, a large portion of the escaping light is usually lost through this front surface due to the random nature of the secondary interactions of the light rays with the pyramids. Furthermore, up to 10 percent or more light can be lost in conventional photovoltaic systems due to the reflection from front contacts or absorption by layers or surfaces which produce no photovoltaic effect.

An additional problem encountered in photovoltaic devices is that most photovoltaic materials have a relatively large refractive index which results in poor light coupling efficiency due to the high reflection losses from the light receiving surface. The bulk crystalline Si, for example, has the refractive index of 3.57 at 1,000 nm (nanometers) and 5.59 at 400 nm which results in the Fresnel reflection of 32% to 49% of the incident light at 1,000 nm and 400 nm, respectively. Typically, these problems can be addressed by adding an antireflective layer to the light receiving surface and/or surface microstructuring. However, the antireflective coating works efficiently only in a limited bandwidth and adds system cost and processing time, while the microstructures are still somewhat inefficient for light coupling or otherwise are quite expensive to be used for mass production, considering that the entire area of the photovoltaic device must be processed to cover it with these microstructures.

These drawbacks of the prior art approaches and the loss of useful light are hampering the utility of the photovoltaic devices. None of the previous efforts provides an efficient solution for coupling and trapping essentially all of the incident light and allowing it to pass through the sufficient effective depth of photosensitive material or allow the light to interact with the active layer as many times as necessary to cause the efficient light absorption in a controlled manner. It is therefore an object of this invention to provide an improved light harvesting system employing a novel photovoltaic structure with efficient light coupling and trapping thus minimizing energy loss.

The present invention solves the above problems by providing a layered structure having correlated surface relief features or microstructures that allow for enhancing the light coupling efficiency, increasing the light path through the photosensitive material and for trapping the incident light within the device by means of at least TIR. The light trapping causes multiple passage of the trapped light through the photoresponsive (active) layer thus improving the light absorption and energy conversion efficiency. Other objects and advantages of this invention will be apparent to those skilled in the art from the following disclosure.

BRIEF SUMMARY OF THE INVENTION

The present invention solves a number of light harvesting problems within a compact system utilizing efficient light coupling and trapping mechanisms. Light is injected into a photoresponsive layer through light input ports using a focusing array and trapped within the layer so that the useful light absorption is substantially enhanced.

A light harvesting system employing microstructures for efficient light trapping and comprising a focusing array and a photoresponsive layer is described. The focusing array comprises a plurality of light collecting elements distributed over a planar surface of the array. Each light collecting element is configured to collect light from a larger area and focus the incident light onto a substantially smaller focal area. The photoresponsive layer comprises light input ports formed in its light receiving surface. Each light input port is disposed in energy receiving relationship with respect to at least one light collecting element of the focusing array. More particularly, each light input port is disposed in a vicinity of the respective light collecting element and aligned (centered) with respect to its optical axis. Each light input port is configured to receive a focused light beam and communicate it into the photoresponsive layer a sufficiently oblique angle so as to result in an improved light coupling and generally increased light path and absorption in said layer compared to the case when light enters the photoresponsive layer elsewhere through its light receiving surface.

The invention is amenable to being embodied in a number of ways, including but not limited to the following descriptions.

At least one embodiment of the invention is configured as a light harvesting system comprising: (a) a photoresponsive layer configured to internally absorb at least a portion of the light propagating through its body; (b) a plurality of light input ports associated with a light receiving surface of said photoresponsive layer; and (c) a plurality of light collecting elements within a planar focusing array configured for focusing received light onto said light input ports. Each of the plurality of light input ports is configured to communicate the incident light into the photoresponsive layer at a sufficiently oblique angle so as to increase the optical path of the light rays through the designated layer. The device operates in response to the light received on the aperture of the focusing array being injected into the photoresponsive layer and angularly redirected at generally oblique angles with respect to the prevailing plane of the light harvesting system.

In at least one implementation, the light harvesting system further comprises at least one electrical contact associated with the photoresponsive layer. In at least one further implementation, the electrical contact associated with the photoresponsive layer is made from an optically transparent material. In at least one implementation, the electrical contact associated with the photoresponsive layer comprises a reflective metallic material and is made in the form of a grid. In at least one implementation, the electrical contact comprises a reflective metallic material and is made in the form of a thin sheet or a film. In at least one implementation, the electrical contact comprises a plurality of electrical contact fingers disposed in spaces between adjacent pairs of light input ports and away from the light paths of the focused beams formed by the light collecting elements. In at least one implementation, the photoresponsive layer comprises at least one photovoltaic cell.

In alternative implementations, the planar focusing array and its light collecting elements can be configured in different ways. In at least one implementation, the focusing array comprises a lenticular lens array. In at least one implementation, the focusing array comprises a point-focus lens array. In at least one implementation, the focusing array comprises point focus lenses which have a shape selected from the group consisting of round, rectangular, square, and hexagonal. In at least one implementation, each of the light collecting elements is selected from the group of optical elements consisting of imaging lenses, non-imaging lenses, spherical lenses, aspherical lenses, lens arrays, Fresnel lenses, TIR lenses, gradient index lenses, diffraction lenses, mirrors, Fresnel mirrors, spherical mirrors, parabolic mirrors, mirror arrays, and trough mirrors.

In different implementations, the plurality of light input ports can be differently configured. In at least one implementation, each of the plurality of light input ports is disposed in a predetermined alignment with the plurality of light collecting elements. In at least one implementation, the oblique propagation angle within the photoresponsive layer is so selected as to result in the propagation of at least a substantial portion of light rays at sufficiently high angles, above the predetermined critical angle for total internal reflection (TIR), with respect to a surface normal to at least one surface of said photoresponsive layer. In at least one implementation, each of the plurality of light input ports comprises a refractive or reflective face inclined at an angle with respect to the prevailing plane of the photoresponsive layer. In at least one implementation, the plurality of light input ports comprises a parallel array of elongated grooves. In at least one implementation, each of the plurality of light input ports comprises at least one cavity. In at least one implementation, the cavity has a sufficiently high aspect ratio. In at least one implementation, each of the light input ports comprises at least one surface relief feature selected from the group of elements consisting of cavities, holes, extensions, bulges, prisms, prismatic grooves, cones, conical cavities, funnel-shaped cavities, surface texture, reflective surfaces, refractive surfaces, diffraction gratings, holograms, light scattering elements, and so forth.

In further implementations, the light harvesting system can be configured in various ways to enhance the light trapping in the photoresponsive layer. In at least one implementation, the light harvesting system further comprises an optical interface disposed between the photoresponsive layer and the focusing array and characterized by a drop in refractive index in the direction of light propagation from the photoresponsive layer toward the focusing array. In at least one implementation, the light harvesting system further comprises means for promoting a total internal reflection in the photoresponsive layer.

In at least one implementation, the focusing array and the photoresponsive layer are adapted for being retained in a translated, a reversed and/or a rotated orientation relative to each other toward adjusting the acceptance angle or for tracking the source of light. In at least one further implementation, the light harvesting system can comprise at least one tracking means for tracking a light source.

At least one embodiment of the invention is configured as a light harvesting system having a layered structure and comprising: (a) a photovoltaic layer disposed between a first and a second reflective surfaces; and (b) a light focusing layer having surface relief features each configured to focus the incident light. At least one of the first and second reflective surfaces comprises light input ports disposed in energy receiving relationship to the surface relief features and configured to inject incident light into the space between the first and second reflective surfaces so as to cause multiple passage of light through the photovoltaic layer.

In at least one implementation, at least one of the first and second reflective surfaces is configured for reflecting light by means of at least TIR. In at least one implementation, the light harvesting system is further comprising at least one cladding layer associated with at least one of the first and second reflective surfaces. In at least one implementation, at least one of the first and second reflective surfaces is associated with a mirror layer comprising a metallic material. In at least one implementation, at least one of the first and second reflective surfaces is associated with a mirror layer comprising a Bragg reflector. In at least one implementation, the light focusing layer comprises a lens array. In at least one implementation, the photovoltaic layer comprises at least one photovoltaic cell. In at least one implementation, the photovoltaic layer is associated with at least one light detector. In at least one implementation, each of the light input ports is formed by a microstructured area in at least one of the first and second reflective surfaces.

The present invention provides a number of beneficial elements which can be implemented either separately or in any desired combination without departing from the present teachings.

An element of the invention is a light harvesting system collecting light over a given area and communicating the incident light into a photoresponsive layer, such as a photovoltaic layer, with an enhanced light coupling efficiency and with increasing the light path through the photoresponsive layer.

Another element of the invention is a plurality of light collecting elements within a focusing array which collectively collect the incident light over a broad area and focus it into a plurality of small-aperture focal areas.

Another element of the invention is the inclusion of distributed light input ports, such as areas having surface relief features, microstructures or texture, associated with a light receiving surface or the interior of photoresponsive layer and disposing them in a light receiving relationship to the light collecting elements of the focusing array.

Another element of the invention is the inclusion of one or more cladding layers or mirrored surfaces to enhance respectively the total internal reflection or the specular reflection of light within the photoresponsive layer.

Another element of the invention is the use of electrical contacts which can additionally be provided with enhanced reflective properties to promote retaining the light within the photoresponsive layer.

Another element of the invention is the use of contact fingers associated with the light receiving surface of the photovoltaic layer and disposed in the spaces between the pairs of adjacent light input ports and away from the light paths of the focused beams formed by the light collecting elements.

Another element of the invention is the use of linear arrays of light collecting elements and/or light input ports which span the surface of the device, or a portion thereof. Alternatively, another element of the invention is the use of point-focus arrays of light collecting elements and/or light input ports as well as portions and combinations of linear and point-focus arrays thereof.

Another element of the invention is the use of a predetermined alignment for disposing the light collecting elements with respect to the light input ports and/or the electrical contacts.

Another element of the invention is the use of light input ports in the form of cavities, holes or other microstructures having a sufficiently high aspect ratio.

Another element of the invention is the use of light input ports each comprising a refractive or reflective face inclined at an angle to the light receiving surface of the photoresponsive layer for injecting at least a substantial part of the incident light into the layer at an oblique angle.

Another element of the invention is the use of tracking means for tracking a light source.

A still further element of the invention is a light harvesting system which can be utilized in a wide range of light collecting or light sensing applications.

Further elements of the invention will be brought out in the following portions of the specification, wherein the detailed description is for the purpose of fully disclosing preferred embodiments of the invention without placing limitations thereon.

BRIEF DESCRIPTION OF THE SEVERAL VIEWS OF THE DRAWING(S)

The invention will be more fully understood by reference to the following drawings which are for illustrative purposes only:

DETAILED DESCRIPTION OF THE INVENTION

Referring more specifically to the drawings, for illustrative purposes the present invention is embodied in the apparatus generally shown in the preceding figures. It will be appreciated that the apparatus may vary as to configuration and as to details of the parts without departing from the basic concepts as disclosed herein. Furthermore, elements represented in one embodiment as taught herein are applicable without limitation to other embodiments taught herein, and in combination with those embodiments and what is known in the art.

A wide range of applications exist for the present invention in relation to the collection of electromagnetic radiant energy, such as light, in a broad spectrum or any suitable spectral bands or domains. Therefore, for the sake of simplicity of expression, without limiting generality of this invention, the term "light" will be used herein although the general terms "electromagnetic energy", "electromagnetic radiation", "radiant energy" or exemplary terms like "visible light", "infrared light", or "ultraviolet light" would also be appropriate.

Figure 1:
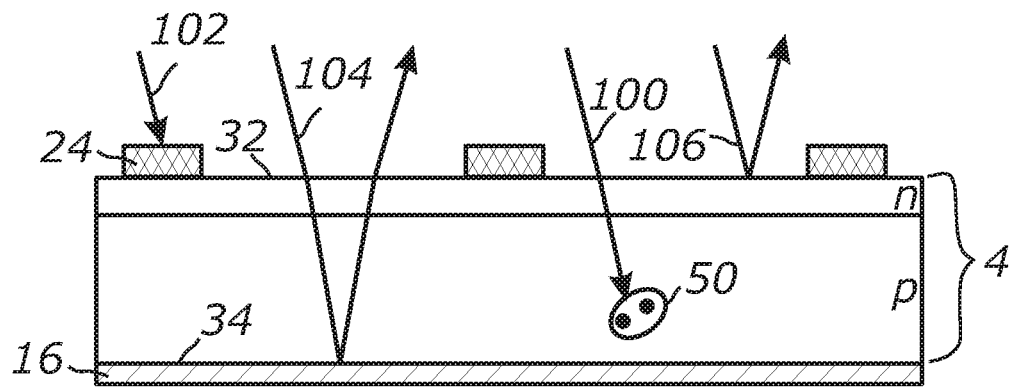
FIG. 1 and FIG. 2 are schematic diagrams and ray tracing for conventional photovoltaic systems.
Figure 2:
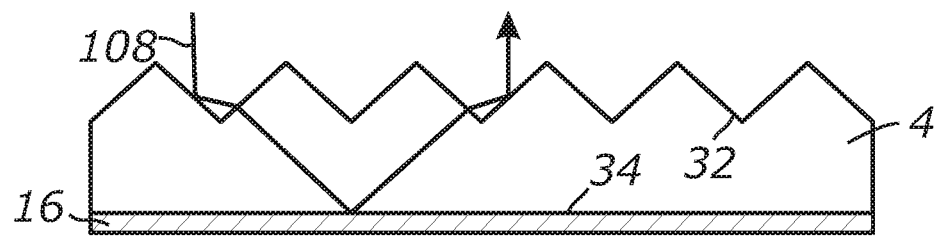

In order to be able to compare and contrast the present invention with typical photovoltaic structures, FIG. 1 and FIG. 2 are shown to illustrate the operation of a common crystalline silicon (Si) solar cell typically employing a photovoltaic layer 4 of mono- or polycrystalline silicon with a p-n junction formed by joining n-type and p-type Si. Individual rays interacting with the photovoltaic structure are illustrated by line segments that, by way of example and not limitation, can represent the paths of individual photons of the incident light beam or otherwise represent possible light paths. In FIG. 1, a front contact is formed by contact fingers 24 attached to a front surface 32 of photovoltaic layer 4 and a back contact 16 is formed by a metallic layer attached to a back surface 34 of photovoltaic layer 4.

Referring further to FIG. 1, an incident light ray 100 emanated by a distant source and entering photovoltaic layer 4 is absorbed within this layer with the generation of an electron-hole pair 50 due to the photo effect. The front and back contacts of the cell collect the charge carriers thus generating useful photocurrent in an external circuit (not shown). A ray 102 strikes a contact finger 24 and is absorbed or scattered without photocurrent generation. A ray 104 entering photovoltaic layer 4 is reflected from back contact 16 and exits back into the environment without being absorbed and thus without producing the photocurrent. Finally, a ray 106 striking front surface 32 of photovoltaic layer 4 is reflected from the surface without penetration into the photoactive layer and without useful absorption. Thus, ray 100 represents a useful, absorbed photon or photons while rays 102, 104 and 106 represent photons that are lost due to various optical loss mechanisms. It should be noted that the light rays shown in FIG. 1 do not necessarily represent all possible light paths or absorption and loss scenarios and are merely provided for the purpose of illustrating some of the most common loss mechanisms.

In FIG. 2, a conventional pyramid microstructure of the photovoltaic cells is illustrated along with the typical light trapping mechanism (the front contacts, p-n structure and other layers customary to photovoltaic devices, such as passivation, diffusion, antireflective layers, etc., are not shown here for clarity). When a ray 108 strikes the surface of a pyramid formed in the front surface of photovoltaic layer 4 and if it is reflected from the pyramid surface, it has another chance to enter layer 4 through the surface of an adjacent pyramid. Thus, the overall surface reflectivity is somewhat reduced compared to the flat surface having no microstructures. Furthermore, since ray 108 now enters layer 4 at a greater angle with respect to the surface normal, its effective path through the photoresponsive material is increased which can result in better light absorption.

However, ray 108 bouncing from back contact 16 exits layer 4 the next time it interacts with the front surface. It will be appreciated by those skilled in the art, that if the chance of light reflection from the front surface of layer 4 is further reduced and if the effective light path in layer 4 is further extended, the useful light absorption will increase thus resulting in the enhanced photocurrent generation. In conventional devices, further reducing the front surface reflectivity requires applying antireflective coatings or implementing more expensive and less practical microstructuring methods for the entire surface. The extension of the effective light path usually requires the increase in material thickness thus resulting in greater material consumption which can be detrimental to the system cost effectiveness.

Figure 3:
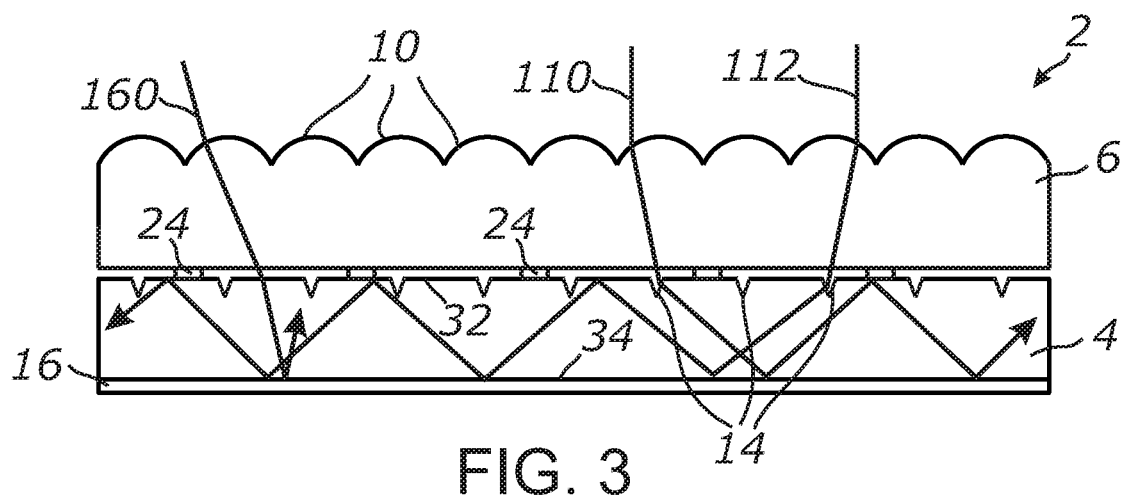
FIG. 3 is a schematic view and ray tracing of a light harvesting system in accordance with at least one embodiment of the present invention.

FIG. 3 illustrates, in a schematic cross-section, an embodiment of a light harvesting system 2 in accordance with at least one preferred embodiment of the present invention. Referring to FIG. 3, light harvesting system 2 comprises a planar layered structure including a focusing array 6, a front contact exemplified by a grid of contact fingers 24, a photoresponsive layer exemplified by photovoltaic layer 4, and a back contact 16.

Focusing array 6, hereinafter referred to also as a lens array, comprises an array of imaging micro lenses 10. The lens array can be made from of a sheet or planar plate or slab of a transparent material by appropriate contouring its frontal surface and obtaining surface relief features approximating individual refractive lenses. Each lens has a spherical or aspherical light input surface and is configured to receive an impinging beam of light, as may emanate from a distant light source (not shown), and to focus this incident light in at least one dimension onto a focal area having a transversal size substantially smaller than the transversal size of the lens in the same dimension.

For the purpose of this invention and from the practical standpoint, the terms "focal area" or "focus" of an individual lens 10 of lens array 6 should be understood broadly and generally refers to an area within the envelope of the focused beam which said lens may form when exposed to an incident beam of light, where said area has a cross section substantially smaller than the cross section of respective lens 10. Accordingly, the focal area can include areas at a relatively small distance from the "ideal" focus of lens 10 and where the focused beam can be convergent (before focus) or divergent (after focus).

It will be appreciated by those skilled in the art that focusing array 6, when positioned with one side representing the entrance aperture perpendicular to the incident beam, will provide a plurality of foci on the opposite side which will be spaced apart from each other in accordance with the spacing of individual lenses in the lens array. A planar lens array formed by lenses 10 having the same focal length will form a plurality of foci in a common focal plane disposed at a distance from lenses 10.

In accordance with at least one embodiment of the present invention, the focal length of each lens 10 in the lens array is selected to approximate the thickness of the layer forming the array. More particularly, when each micro lens in the lens array has a convex spherical shape with the radius of curvature R and the index of refraction of the transparent material forming the lens array is n, the approximate lens array thickness T can be found from the following expression:

$$T \approx \frac{nR}{n-1}.$$

Thus, focusing array 6 will form a plurality of foci in a plane located in a proximity of its back surface at a focal distance from lenses 10.

Focusing array 6 can have a linear, or linear-focus, geometry when it is based on lenticular lenses 10 providing light focusing in one dimension. Alternatively, it can have a point-focus geometry when it is based on lenses 10 focusing the incident light in two dimensions. While a cross-section of system 2 is illustrated in FIG. 3, it should be understood that individual lenses 10 forming the focusing array 6 can be of any desired configuration which provides for concentration of the received light into a plurality of the focal areas, including but not limited to lenticular, cylindrical, round, hexagonal, square, rectangular, linear-focus, point-focus, and can be packed with any desired density across the entrance aperture of focusing array 6.

Figure 4:
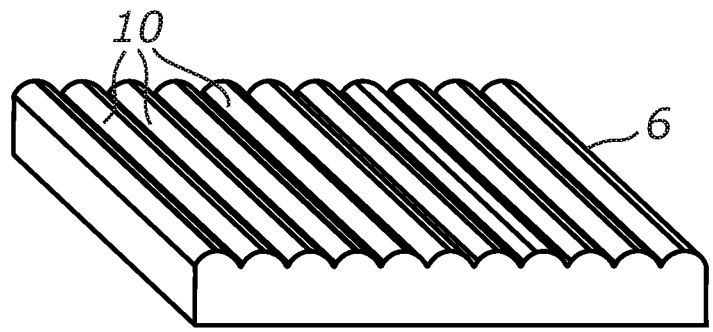
FIG. 4 is a perspective view of a focusing array according to at least one embodiment of the present invention, showing the use of a planar lenticular lens array.
Figure 5:
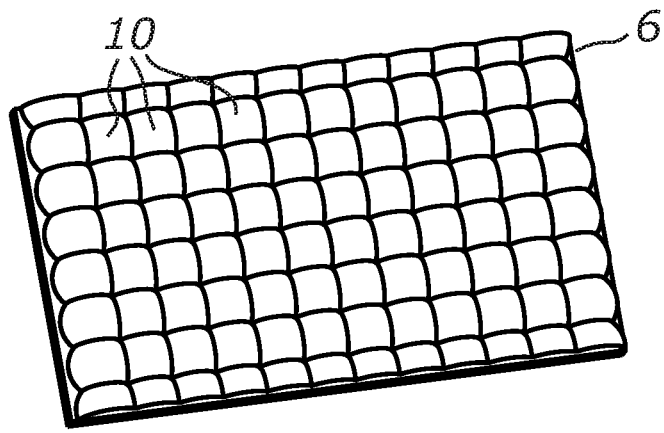
FIG. 5 is a perspective top view a focusing array according to at least one embodiment of the present invention, showing the use of a planar lens array employing point focus lenses.
Figure 6:
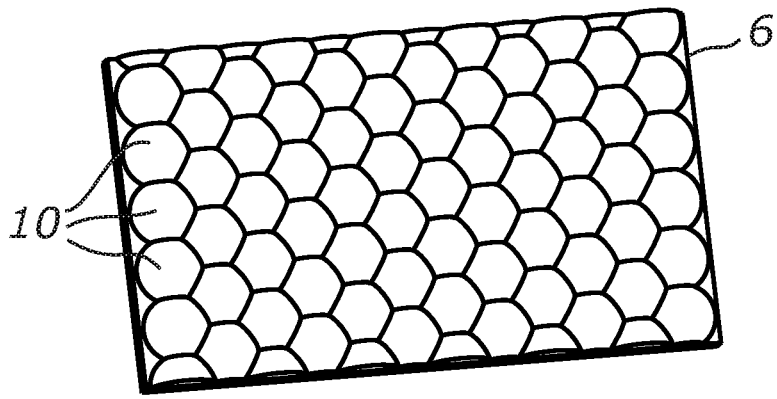
FIG. 6 is a perspective top view of a focusing array according to at least one embodiment of the present invention, showing a different arrangement and shapes of point focus lenses than were shown in FIG. 5.

FIG. 4 illustrates an exemplary configuration of focusing array 6 as a lenticular lens array employing cylindrical lenses 10. In a further example, FIG. 5 illustrates a densely packed configuration of the focusing array 6 formed by point-focus lenses 10 each having a square aperture which allows to cover about 100% of the lens array with the lens area. In a yet further example illustrated in FIG. 6, point-focus lenses 10 have an alternative hexagonal shape which also provides for the high packing density of the lenses in the lens array.

Lenses 10 can be fabricated using any conventional method such as replication, molding, embossing, micro-machining, grinding, chemical etching, beam etching and the like. The individual lenses 10 can be integrated with focusing array 6 and preferably comprise the same material as the body of the array. Alternatively, lenses 10 can be formed on a transparent substrate sheet or film and fabricated of the same or a different material than the substrate. Individual lenses 10 can also be configured as separate pieces and attached to the substrate sheet or plate. Suitable materials for making focusing array 6 and/or lenses 10 include but are not limited to optical glass, polymethyl methacrylate (PMMA), silicone, polycarbonate, polystyrene, polyolefin, any optically clear resin which is obtainable by polymerization and curing of various compositions or other materials suitable for creating a sufficiently transparent structure. The placement of lenses 10 in focusing array 6 can be according to any suitable spatial metric and by any desired means. For example, lenses 10 can be spaced apart, contacting each other or overlapping and can be positioned in any desired pattern in the array.

Focusing array 6 can have one or more layers of anti-reflective coating (not shown) deposited on its frontal surface and/or the opposite surface in order to reduce the Fresnel reflections at optical interfaces and improve the light transmission of the array. Also, an anti-reflective layer can be embedded at any suitable part of system 2, e.g. between any of its layers to further promote the transmissivity and overall system efficiency. For these purposes, conventional anti-reflective coatings such as $TiO_2$ deposited by Atmospheric Pressure Chemical Vapor Deposition (APCVD) and $Si_3N_4$ deposited by Plasma Enhanced Chemical Vapor Deposition (PECVD) can be used, for example.

Additionally, any suitable encapsulation or adhesion promoting layers can be incorporated into system 2. Particularly, EVA resin, fluoropolymer or optically clear silicone can be provided for encapsulating photovoltaic layer 4.

Photovoltaic layer 4 preferably has generally smooth front and back surfaces so that the light scattering of light interacting with these surfaces is minimized. Photovoltaic layer 4 may include any suitable photovoltaic element or structure that absorbs light and converts it into charge carriers and/or electric current and can comprise one or more photoabsorptive layers. More particularly, photovoltaic layer 4 may incorporate any structures or design commonly found in solar cells of photovoltaic light detectors.

By way of example and not limitation, photovoltaic layer 4 can be made from crystalline silicon so that one side is p-type, dominated by positive holes, and the other side is n-type, dominated by negative electrons. The free electrons and holes generated by light in the silicon diffuse to the p/n junction junction formed by p-type crystalline Si layer and n-type crystalline Si layer and then separate to produce an electric current.

In a further example, photovoltaic layer 4 may incorporate a thin film photovoltaic structure such as that found in amorphous silicon (a-Si) solar cells where a typical cell can employ a p-i-n design, in which a middle intrinsic layer (i-type or undoped) is sandwiched between a p-layer and an n-layer. When photovoltaic layer is of a-Si cell type, the top layer can be p-type a-Si, the middle layer can be intrinsic silicon layer, and the bottom layer is n-type a-Si. In this case, light entering photovoltaic layer 4 is at least partially absorbed and generates free electrons and holes in the intrinsic region, which are then separated by the electric field. Similarly, a CdTe photovoltaic structure with an n-i-p design can be employed in which the top layer can be cadmium sulfide (CdS), the middle layer can be intrinsic CdTe, and the bottom layer can be zinc telluride (ZnTe). In a further example, photovoltaic layer 4 can be also designed as a copper indium gallium deselenide (CIGS) structure.

In a yet further example, photovoltaic layer 4 can incorporate a multi-junction PV structure which can have the so-called cascade or tandem architecture and can be based on two or more individual cells with different bandgaps stacked on top of one another. Photons in a spectral band that is not absorbed well by the first cell are transmitted to the second cell, which then absorbs at least a portion of the remaining solar radiation while it can remain transparent to the lower-energy photons. This selective absorption process continues through the entire stack of individual cells forming photovoltaic layer 4 and being designed for the respective bandgaps so that more solar energy spectrum is absorbed compared to a single-cell design of the photovoltaic layer. A multi-junction cell can be made as a mechanical stack of independently made solar cells or as a monolithic structure in which one complete solar cell is made first, and then the layers for the second cell are grown or deposited directly on the first.

In a yet further example, photovoltaic layer 4 can incorporate Si or other semiconductor photovoltaic materials in the form of particles, spheres, rods, clusters, quantum dots, nanodots, nanowires, etc. embedded into various transparent or semi-transparent materials, such as films of silicon oxide and silicon nitride abound. Such embedded photovoltaic features can be evenly or unevenly distributed with a prescribed concentration in the bulk of photovoltaic layer 4 and can allow for efficient conversion of light into electricity provided the optical path of rays propagating in said photovoltaic layer is sufficiently long for the full light absorption.

Photovoltaic layer 4 can be associated with ohmic metallic or non-metallic contacts or electrodes which in turn can be connected to an external load. These contacts are exemplified by front contact fingers 24 and back contact 16 in FIG. 3. The charge carrier separation in photovoltaic layer 4 can be done by any conventional means, for example, using drift of carriers driven by an electrostatic field established across the layer or using diffusion of carriers from zones of high carrier concentration to zones of low carrier concentration. Either or both front and back surfaces of photovoltaic layer 4 can have a full area metal or non-metal contact or a grid-like metal contact made up of fine "fingers" and larger "busbars" which can be, for example, screen-printed onto the respective surface using a silver or aluminum paste. If metal screen printing is used the contacts can be fired at several hundred degrees Celsius to form good ohmic contact with the material of photovoltaic layer 4 and can further be electro-plated to further enhance the device efficiency.

Back contact 16 can also be customarily covered with a suitable protective backsheet material (not shown) for protecting it and photovoltaic layer 4 from the environment. The backsheet can also include any suitable layers or coatings such as radiation protective coatings or films, scratch and stain resistant coatings, and the like. An illustrative example of the protective backsheet is Polyvinyl fluoride (PVF), a fluoropolymer which is commercially available as a film from DuPont and is sold under the Tedlar® brand.

According to at least one embodiment of the present invention, the photoabsorptive layer, or layers, if more than one, that form photovoltaic layer 4 can be made relatively thin in order to reduce the intake of expensive semiconductor materials. The photoabsorptive layer can be made so thin that it absorbs only a small portion of the incident light in a single path. For example, 10% or less incident sunlight can be absorbed when the light passes through photovoltaic layer 4 in either direction at normal incidence. The rest of the light, however, can be absorbed in system 2 through multiple passages of light through photovoltaic layer 4 as well as through increasing the light path through the photoabsorptive layer(s) by means of communicating the light oblique angles and/or by means of light trapping.

Referring further to FIG. 3, photovoltaic layer 4 is further configured to have light input ports 14 formed in its front surface 32. According to at least one embodiment of the present invention, each light input ports 14 can comprise at least one refractive surface or face formed by microstructuring surface 32 and disposed at an angle to surface 32. Light input ports 14 can include any suitable surface relief micro-structures such as interruptions, recesses, holes, cavities, micro-extensions or bulges in otherwise smooth surface 32 which promote light coupling into photovoltaic layer 4. A variety of methods can be utilized for creating such surface relief micro-structures. By way of example, cavities of various shapes and profiles can be fabricated using a technique for direct material removal including drilling, mechanical scribing, laser scribing, micromachining, chemical etching, ion beam etching, reactive ion etching, plasma etching or any other known method suitable thereof for surface micro structuring. In addition, the walls of the formed cavities can be optionally polished, as desired, to obtain any suitable level of polished smooth surface.

Light input ports 14 have the same number as the number of lenses 10 in focusing array 6 disposed on top of photovoltaic layer 4. Light input ports 14 are also distributed over surface 32 in accordance with the distribution of lenses 10 in the lens array so that there is a pairwise optical relationship between each lens 10 and the corresponding light input port 14. It is also preferred that lenses 10 and light input ports 14 are distributed so that contact fingers 24 are disposed between the optical axes of lenses 10 and away from the optical paths in order to allow the focused light to enter photovoltaic layer 4 through light input ports and minimize light interception by contact fingers. In other words, when contact fingers 24 are disposed between the optical centers of lenses 10, each lens 10 effectively steers the focused light away from the contact fingers and eliminates light shadowing by the front electrical contacts thus further enhancing the light coupling and system efficiency.

When focusing array 6 is formed by a lenticular lens array, each light input port 14 can extend parallel to the respective lens 10 and along its entire length. In a cross-section, such as that illustrated in FIG. 3, the receiving aperture of each light input port 14 can be centered with respect to the optical axis of the matching lens 10.

It is important that at least the transversal size of each light input port 14 is substantially smaller than the distance between the adjacent light input ports so that the cumulative area occupied by light input ports 14 on surface 32 is substantially less than the area of said surface. Yet, the receiving aperture of each light input port 14 should be sufficient in order to intercept at least a substantial portion of the light focused by the respective lens 10. It is generally preferred that light input ports occupy no more than approximately 10% of surface 32.

According to at least one embodiment of the invention, the transversal size of each light input port 14 is selected to approximate that of the focal area of the respective lens 10. In this case and when, for example, focusing array 6 is formed by densely packed cylindrical lenses each having the focal area which is about 20 times smaller than the aperture of the lens, light input ports 14 will cumulatively occupy approximately 5% of the area of surface 32. In a further example, if each lens 10 has a point focus with 400 times geometrical concentration (the geometrical concentration being defined as the ratio between the aperture of the lens and the focal area in a plane perpendicular to the lens's optical axis), the cumulative area of light input ports 14 will make approximately 0.25% of the area of surface 32.

Referring yet further to FIG. 3, each input port 14 is formed by a recessed surface relief feature having a V-shaped profile in a cross-section and at least one open refractive face inclined at an angle with respect to surface 32. When light input port 14 has multiple faces, at least one such face can be mirrored for specular reflectivity.

Figure 7:
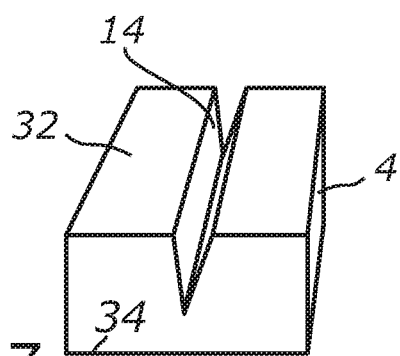
FIG. 7 is a schematic view of a photovoltaic layer portion comprising an elongated V-shape groove, according to at least one embodiment of the present invention.
Figure 8:
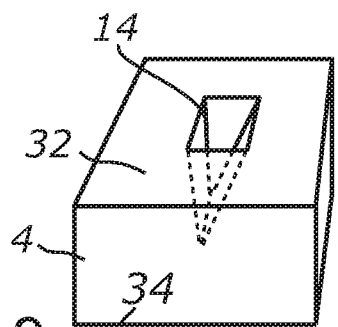
FIG. 8 is a schematic view of a photovoltaic layer portion comprising a V-shape groove which has a shorter length than the elongated grove shown in FIG. 7, according to at least one embodiment of the present invention.
Figure 9:
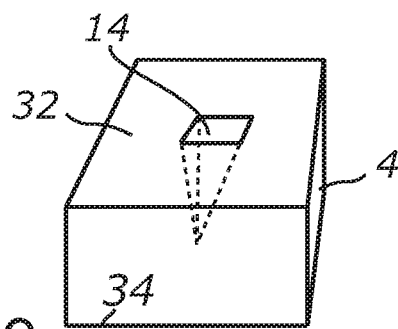
FIG. 9 is a schematic view of a photovoltaic layer portion comprising a cavity having a pyramidal shape, according to at least one embodiment of the present invention.
Figure 10:
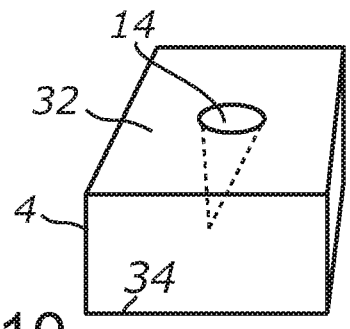
FIG. 10 is a schematic view of a photovoltaic layer portion comprising a cavity having a conical shape, according to at least one embodiment of the present invention.

FIGS. 7 through 10 illustrate various exemplary configurations of light input port 14 which can be represented by a V-shaped cross-section shown in FIG. 3. Particularly, FIG. 7 shows an elongated V-groove which can extend all the way along surface 32 or its substantial portion. FIG. 8 shows a shorter V-groove which can still have an elongated shape or it can have same or similar longitudinal and transversal dimensions. FIG. 9 shows a pyramidal shape of the cavity representing light input port 14. FIG. 10 shows a cone-shape cavity forming light input port 14. Light input ports 14 can also be formed by cavities having the shape of a funnel with curvilinear walls which can operate similarly to the conical shape.

In at least some embodiments of the present invention, light input ports 14 are formed by high aspect ratio cavities or recesses in surface 32. In the context of describing a surface relief feature or microstructure element such as a surface cavity or recess, the term "high aspect ratio" is meant to mean a geometric configuration of the microstructure element, in a cross-section, where the height or depth of the microstructure element is approximately equal or greater than its base at the surface. This term also includes the case when the height of the microstructure element is much greater than the base thus corresponding to a relatively deep cavity or recess with almost vertical walls. Each cavity or recess can have at least one face which can be perpendicular to or inclined at an angle to surface 32.

According to an embodiment of the present invention illustrated in FIG. 3, each individual light input port 14 can be viewed as any suitable localized interruption or alteration of the otherwise smooth surface 32 that alters the optical interface properties of the surface in such a way that a fan of rays entering photovoltaic layer 4 through any light input port 14 will be communicated a different angular distribution in at least one dimension within photovoltaic layer 4 compared to the case when the same fan of rays enters photovoltaic layer 4 through the smooth portion of surface 32 elsewhere. In an aspect of this invention, light input ports 14 suppress the normal Snell's law refraction generally characterizing the broad surface 32. It will be appreciated that light input ports 14 alter the surface properties only within their active apertures while the rest of the surface area remains largely unaffected.

In at least one embodiment of FIG. 3, when focusing array 6 and photovoltaic layer 4 are sandwiched together, the cavities of light input ports 14 can remain filled by atmospheric-pressure air trapped during the assembly. Alternatively, system 2 can be assembled under vacuum and focusing array 6 and photovoltaic layer 4 can be sealed together so that the cavities of light input ports 14 can contain low-pressure air or vacuum.

In operation, referring yet further to FIG. 3, incident light entering system 2 is captured and injected into photovoltaic layer 4 at oblique angles which allows for increasing the light path inside the photoresponsive layer(s) and for trapping the light between the parallel surfaces of photovoltaic layer 4, as illustrated by the paths of exemplary rays 110 and 112. Ray 110 is collected by one of the lenses 10 of focusing array 6 and directed to light input port 14 disposed in the vicinity of the focus of the lens 10 communicating an initial bend angle to ray 110. Light input port 14 communicates a further bend angle to ray 110 resulting in an oblique incidence of the ray into photovoltaic layer 4. Since light input port 14 is structured as a cavity, the light coupling of ray 110 is improved compared to the case when light enters photovoltaic layer through its planar surface and when the incident ray can be reflected from the surface of high-refractive-index photovoltaic layer 4 due to the Fresnel reflection. Furthermore, the light path of ray 110 is increased compared to the case when light enters photovoltaic layer through its smooth surface.

Obviously, some rays propagating in photovoltaic layer can strike one of the light input ports 14 and can be scattered, reflected or absorbed as a result. Such secondary interactions with light input ports 14 can also result in the respective ray exiting photovoltaic layer 4 without being fully absorbed. However, since the size of microstructures forming light input ports 14 and distributed through surface 32 is relatively small, the chance of ray 110 encountering another light input port and decoupling from photovoltaic layer 4 is also reduced compared to the case when the entire surface 32 is covered with microstructures (as in a conventional monocrystalline Si cell, for example). It will be appreciated by those skilled in the art that the greater the concentration achieved by lenses 10 and the smaller the respective focal spots and thus the smaller light input ports 14 are, the lesser light losses will be and the greater light absorption efficiency can be achieved.

Similarly, ray 112 is injected into photovoltaic layer 4 at an oblique angle by another matching pair of lens 10 and light input port 14. Accordingly, ray 112 can also propagate through a greater effective thickness of the photoresponsive material due to off-normal propagation and due to bouncing from parallel opposing surfaces 32 and 34 until it is absorbed.

While the pairs of lenses 10 and light input ports 14 work best for injecting a direct normal-incidence beam received by the entrance aperture of focusing array 6 into photovoltaic layer 4 at advantageously oblique angles, system 2 can harvest off-axis rays as well as illustrated further in FIG. 3. An exemplary off-axis ray 160 striking one of lenses 10 passes through the transparent body of focusing array 6 and enters photovoltaic layer 4. Ray 160 can represent any applicable off-axis light such as, for example, stray light, diffuse background light, or direct beam when system 2 is not pointed directly at the light source. In the illustrated case, the angle of incidence of ray 160 onto focusing array is greater than the acceptance angle of lens 10 so that this off-axis ray can miss the corresponding light input port 14. Therefore, ray 160 enters photovoltaic layer 4 through a smooth portion of surface 32. While the efficiency of light coupling and trapping of ray 160 can be considerably less than that of rays 110 and 112, this ray may nevertheless also propagate through some thickness of photovoltaic layer and therefore also have a chance of being subsequently absorbed.

Figure 11:
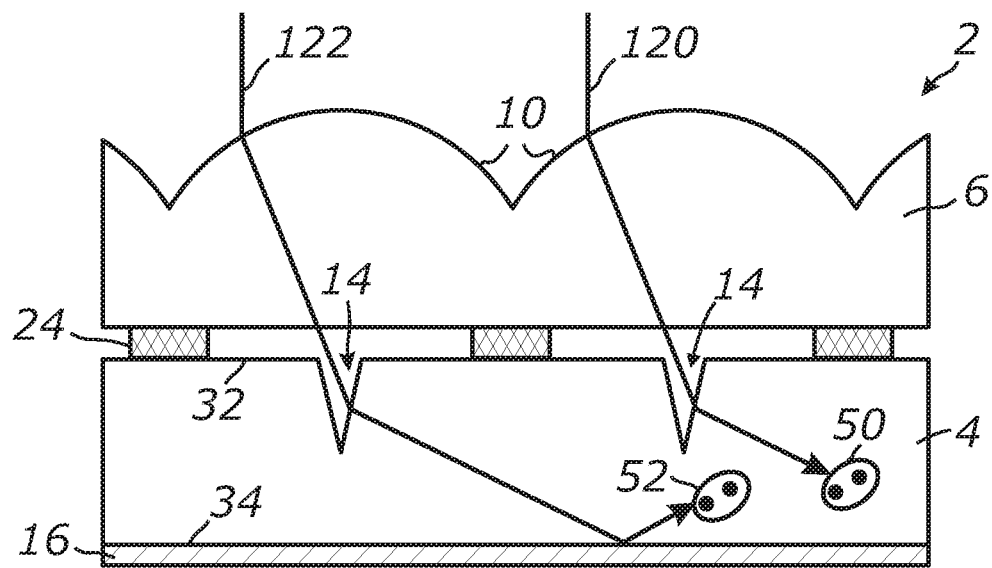
FIG. 11 is a schematic view of a portion of light harvesting system according to at least one embodiment of the present invention.

FIG. 11 illustrates the operation of system 2 shown in FIG. 3 in a further aspect. In FIG. 11, an incident ray 120 entering focusing array 6 at an normal incidence with respect to the prevailing plane of system 2 strikes an individual lens 10 and is directed to the respective focus of the lens where it enters matching light input port 14 formed in surface 32 of photovoltaic layer 4. Ray 120 refracts at a refractive face of the V-shaped cavity forming the light input port 14 and is injected into photovoltaic layer 4 at an oblique angle. Ray 120 propagates in photovoltaic layer until it is absorbed and converted into electron-hole pair 50 due to the photo effect.

Due to the combined effect of two-stage bending, the incident ray by lens 10 and light input port 14, ray 120 is communicated a greater propagation angle with respect to the surface normal of photovoltaic layer 4 as compared to the case when the same ray would enter photovoltaic layer 4 of conventional devices such as those illustrated in FIG. 1 and FIG. 2. Therefore, it can propagate through an effectively thicker layer of photoresponsive material before reaching any surface of photovoltaic layer 4 and thus has a greater chance of being absorbed in a single pass.

Furthermore, even if ray 120 is not absorbed in a single pass, it can bounce from surface 34 by means of a specular reflection or scattering, in which case it can pass through photovoltaic layer 4 at least one more time which increases the chance of absorption with photocurrent generation. This is illustrated by a ray 122 which enters photovoltaic layer 4 at a similar angle as ray 120 but is not absorbed in the single layer passage. Ray 122 reaches surface 34, reflects from the surface back into photovoltaic layer 4 and is absorbed with the generation of another electron-hole pair 52.

According to at least one embodiment of this invention, sufficient specular reflectivity of surface 34 can be provided by metallic back contact 16 so as to result in minimum reflection losses. By way of example and not limitation, if photovoltaic layer 4 comprises a crystalline Si cell, back contact 16 can be conventionally made from aluminum by means of sputtering, sintering, plating or by applying an aluminum film or foil onto surface 34. Aluminum back contact 16 can be subsequently fired at high temperature which will normally provide p+ doping for a Si-type cell and improve the photovoltaic performance of the device. Alternatively, contact 16 can be made by depositing a silver layer which will provide both good reflectance of surface 34 and back contact conductivity.

Obviously, when the light beam focused by lens 10 enters the cavity of light input port 14, at least some rays can undergo Fresnel reflection from the surface of the cavity, especially considering the high refractive index of photovoltaic layer 4. Therefore, the shape of the cavity can be selected to provide for improved coupling of the reflected light. By way of example and not limitation, when light input port 14 is formed by a V-shaped cavity, the cavity can be provided with the aspect ratio high enough to prevent escaping the reflected light from photovoltaic layer without having at least a second interaction with the cavity wall(s).

Furthermore, the aspect ratio can be so selected as to allow for multiple Fresnel reflections from the cavity walls thus substantially enhancing the light coupling efficiency into photovoltaic layer 4. Every time the light ray interacts with the surface of the cavity it can enter photovoltaic layer 4 with some refraction while obtaining a greater angle with respect to photovoltaic layer 4 surface normal. The refracted ray can thus further propagate in photovoltaic layer 4 at a sufficiently high angle with respect to a surface normal. Since the cumulative base area and the cross-section area of light input ports is sufficiently small compared to the frontal area a cross-section of photovoltaic layer 4, the probability of the propagating ray exiting through another light input port 14 is relatively low. Therefore, even if the propagation path of the ray is not parallel to the longitudinal dimensions of photovoltaic layer 4 and said ray can strike either surface 32 or 34 multiple times, it will strike mostly the surface portions free of any microstructures and can thus be reflected back into photovoltaic layer 4 maintaining the same incidence angle. The ray will thereby become trapped and its propagation in photovoltaic layer 4 can continue, which may include additional bounces from surfaces 32 and 34 until the ray energy is absorbed and converted to electric current.

Figure 12:
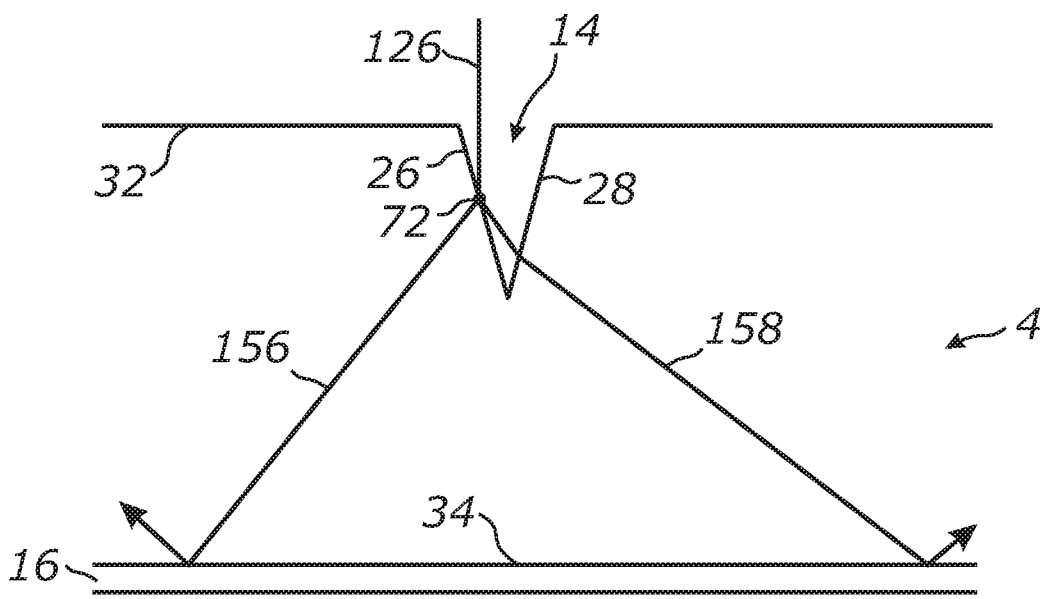
FIG. 12 is a ray tracing of an incident ray being injected into a photovoltaic layer at oblique angles by a V-shaped cavity formed in a photovoltaic layer surface, according to at least one embodiment of the present invention.

FIG. 12 illustrates light coupling through a V-shaped cavity in more detail. A ray 126 of FIG. 12 approaches layer 4 at a near-normal angle, after passing through lens 10 of lens array 6 (not shown), and enters the entrance aperture of light input port 14 where it strikes an inclined face 26 of the cavity at a point 72. Upon entering into photovoltaic layer 4, ray 126 can undergo refraction with a bend angle defined from the relationship $n_1 \sin \theta_1 = n_2 \sin \theta_2$ (Snell's law), where $\theta_1$ is the angle of incidence, $\theta_2$ the angle of refraction, and $n_1$ and $n_2$ are the refractive indices of the medium inside the cavity of light input port 14 and the material of photovoltaic layer 4, respectively. Angles $\theta_1$ and $\theta_2$ are counted off a normal to face 26 at point 72. By way of example, if photovoltaic layer 4 is made of crystalline Si having the refractive index $n_2$ of approximately 3.5 and the medium inside grove 14 is air or vacuum with the refractive index $n_1$ of about 1, the refraction angle can be determined as follows: $\partial_2 = \arcsin(0.29 \sin \theta_1)$.

When ray 126 undergoes refraction at point 72, it can further propagate in the medium of photovoltaic layer 4 (the respective ray segment is denoted as 156). When photovoltaic layer 4 comprises material with sufficiently high refractive index, the larger bend angles can result in increasing the optical path within the photovoltaic layer before it reaches surface 34. Segment 156 or ray 126 can undergo multiple reflections from surfaces 34 and 32 passing photovoltaic layer 4 multiple times till it is absorbed or, when the bend angle is large enough, ray segment 156 may even never reach either surface 32 or 34 before being essentially absorbed and converted to electricity.

Referring further to FIG. 12, ray 126 can also undergo Fresnel reflection from face 26 at point 72. Alternatively, face 26 may be provided with a mirrored surface in which case ray 126 will undergo a specular reflection. The corresponding reflected ray segment is denoted as 158. Although the Fresnel type of reflection typically results in a smaller portion of incident beam energy going into the reflected rays, a greater refractive index of the photovoltaic layer medium and a greater incidence angle can result in a sizable portion of incident ray energy reflecting from the cavity surface. Accordingly, ray segment 158 will cross the volume of the cavity and enter photovoltaic layer 4 through an opposing face 28 of the cavity, even at a greater angle with respect to a normal to the layer's planar surface than segment 156 thus increasing the ray path in it and enhancing the absorption efficiency. Similarly, segment 158 or ray 126 can propagate between surfaces 34 and 32 passing through the effective thickness of photovoltaic layer 4 multiple times till it is absorbed.

Although a near-normal incidence of ray 126 is illustrated in FIG. 12, any other incidence angle within a predetermined range of acceptance angles can be efficiently injected into photovoltaic layer 4 through light input ports 14 formed by a V-shaped cavity. Furthermore the V-shaped cavity forming light input port 14 is not limited to have straight walls as illustrated in FIG. 12. According to at least one embodiment of the present invention, the cavity can also have curvilinear funnel-shaped walls which can naturally result, for example, from the process of formation of light input ports 14 by means of material removal using laser ablation, etching or the like.

Figure 13:
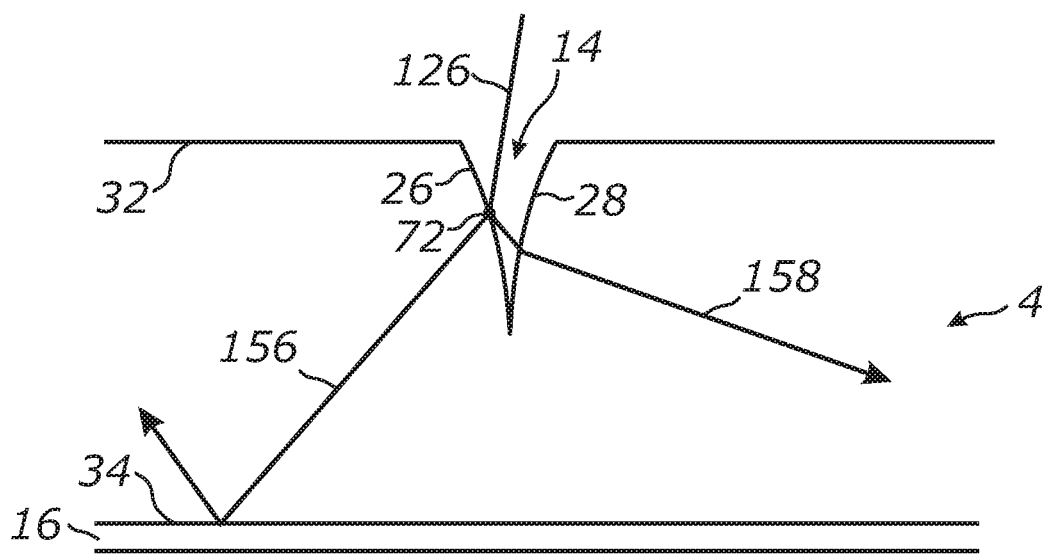
FIG. 13 is a ray tracing of an incident ray being injected into a photovoltaic layer by a funnel-shaped cavity or groove having curvilinear walls, according to at least one embodiment of the present invention.

FIG. 13 shows an example of light input ports 14 formed by a funnel shaped cavity with curved or curvilinear walls and also shows an example of the off-normal incidence of ray 126 onto the entrance aperture of the exemplary light input port 14. Accordingly, ray segments 156 and 158 represent possible light paths of ray 126 after interacting with face 26 of light input port 14 at point 72. In either illustrated case of FIG. 13, ray 126 enters photovoltaic layer 4 and becomes trapped in it with an increased probability of being absorbed due to the extended light path through the photoactive material.

Figure 14:
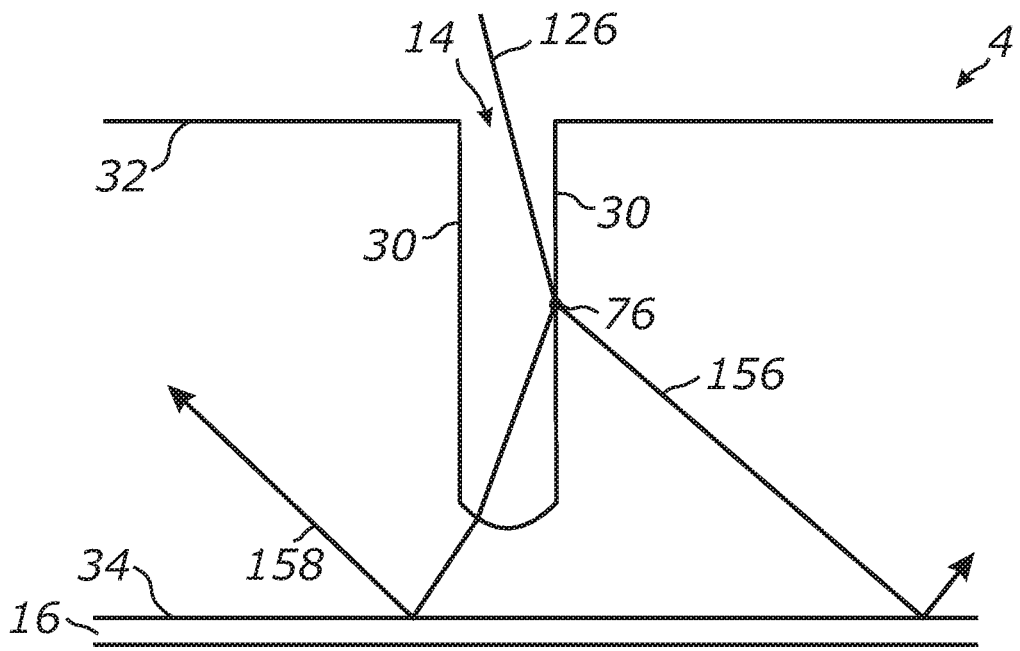
FIG. 14 is a ray tracing of an incident ray being injected into a photovoltaic layer through a blind hole formed in a photovoltaic layer surface, according to at least one embodiment of the present invention.

FIG. 14 illustrates an embodiment of light harvesting system 2 in which an individual light input port 14 is formed in photovoltaic layer 4 by a round blind hole having essentially vertical walls. This hole can be associated with the respective lens 10 of focusing array 6 (not shown) having a point-focus configuration. In operation, ray 126 enters the entrance aperture of the blind hole forming light input port 14 and strikes its vertical wall 30 at point 76. Ray 126 can directly refract into photovoltaic layer 4, as indicated by ray segment 156, or it can enter photovoltaic layer 4 after reflecting once from wall 30, as indicated by ray segment 158. In either case, as a matter of optics, when ray 156 enters photovoltaic layer 4, it has a greater angle with respect to layer 4 surface normal than the incidence angle upon the entrance onto the receiving aperture of light input port 14, thus increasing the length of the optical path in layer 4 and enhancing absorption. Furthermore, when surfaces 32 and 34 have reflective properties, ray 126 will become trapped in the photovoltaic layer 4 and can travel within it until fully absorbed.

Figure 15:
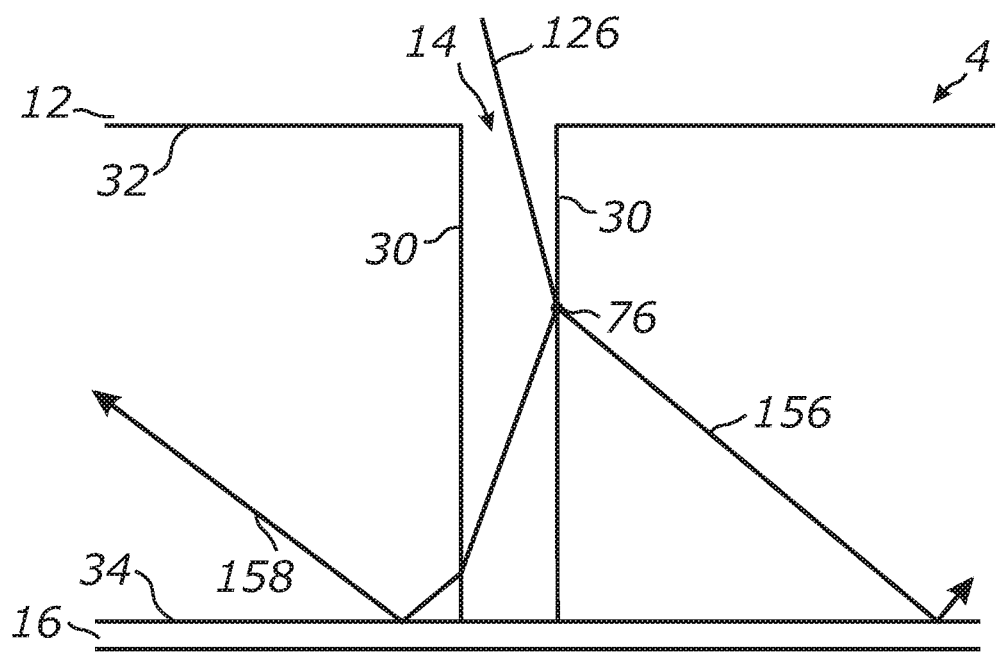
FIG. 15 is a ray tracing of an incident ray being injected into a photovoltaic layer via a through hole, according to at least one embodiment of the present invention.

Similarly, in FIG. 15, a further example of light input port 14 is shown where it is formed by a through hole in photovoltaic layer 4. Accordingly, ray 126 entering the through hole is trapped and absorbed within photovoltaic layer 4. The holes representing light input ports 14 can be made in layer 4 by means of laser ablation, wet or dry etching, drilling or the like processes. Wet chemical etching can also be used for the subsequent processing of light input ports 14 after they are formed to enhance surface smoothness and/or for drilling damage or slag removal. While the holes forming light input ports 14 are shown having vertical walls in FIG. 14 and FIG. 15, it should be understood that this invention is not limited to this and can be applied to the case when the holes are made at an angle to the surface normal of photovoltaic layer. Furthermore, some processes of making the holes may leave non-vertical walls so that an individual hole can have varying diameter along its longitudinal axis. By way of example, if an individual hole is made by laser drilling it can have a slightly conical shape or a curvilinear funnel shape. It should be understood that the embodiments shown in FIG. 14 and FIG. 15 in a cross-section are not limited to the round holes and can include the cases when the respective light input ports 14 are formed by deep linear trenches or grooves having vertical or near-vertical walls and which can be illustrated by essentially the same cross-sections.

Figure 16:
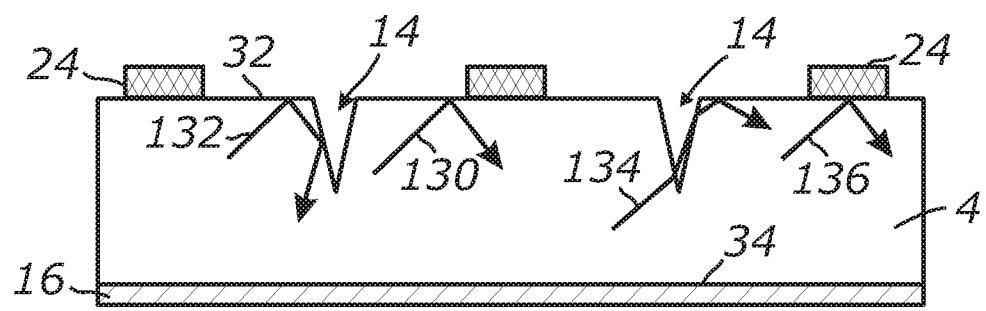
FIG. 16 is a schematic ray tracing diagram of light trapping in a photovoltaic layer, according to at least one embodiment of the present invention.

FIG. 16 further illustrates light trapping in photovoltaic layer 4 of system 2. In FIG. 16, rays 130, 132, 134, and 136 represent various rays injected elsewhere into photovoltaic layer 4 by respective pairs of lenses 10 and light input ports 14 and propagating in the photovoltaic layer 4 after having been reflected at least once from surface 34. Particularly, ray 130 reaches surface 32 where it encounters an optical interface between photovoltaic layer 4 generally having a higher refractive index $n_1$ and the outside medium generally having a lower refractive index $n_2$.

As a matter of optics, when the angle of incidence of ray 130 onto surface 32 is greater than arcsin $n_2/n_1$, ray 130 will undergo a virtually lossless total internal reflection (TIR) back into photovoltaic layer 4. The TIR condition can be relatively easy achieved in system 2 for most rays propagating in photovoltaic layer 4, considering the high refractive index of most photovoltaic materials such as Si ($n_1 \geq 3.5$) and the low refractive index of the ambient air ($n_2 \approx 1$), in which case the critical TIR angle will be approximately 16.6° or less, depending on the wavelength. The critical angle at which TIR occurs will define the escape cone in relation to the angular distribution of rays impinging onto surface 32 internally from the inside of photovoltaic layer 4 so that when an incident ray is outside of this cone, it will become trapped in photovoltaic layer 4.

Even when a layer of conventional encapsulating material is used as an intermediate layer between focusing array 6 and photovoltaic layer 4, such as EVA ($n_2 \approx 1.48$) or optically clear silicone ($n_2 \approx 1.4$), the critical TIR angles at the interface with bulk silicon will be approximately 25° and 23.6°, respectively. Accordingly, the optical configuration of lenses 10 and light input ports 14 can be optimized to provide sufficient bend angles for the entire incident beam so that the TIR condition is met for all rays propagating in photovoltaic layer 4. For this purpose, each surface relief feature 14 should be configured to receive the focused light beam from the respective feature 10 and inject said focused beam into photovoltaic layer with a new angular pattern so that most of the rays in the injected beam will make generally greater angles with respect to a normal to the prevailing plane of system 2 than the half-angle of the escape cone.

The escape cone can be further minimized by selecting low-n materials such as fluoropolymers or certain silicones having the refractive indices in the 1.29-1.36 range or by providing a cladding layer made from any of these materials. In a further alternative, surface 32 can be provided with specular reflective propertied by means of metallization of depositing other highly reflective layers such as, for example, distributed Bragg reflector (DBR).

Similarly, ray 132 of FIG. 16 is shown undergoing TIR or specular reflection from surface 32 and is further shown encountering a wall of the V-shaped cavity of light input port 14. Since the medium in the cavity is air or vacuum with $n_2 \approx 1$, ray 132 undergoes a further TIR from the structure of light input port 14 and still remains trapped in photovoltaic layer 4.

Ray 134 strikes a lower portion of another V-shaped cavity forming light input port 14 of FIG. 16. As it is shown, ray 134 can temporarily exit the bulk material of photovoltaic layer 4 with refraction and then further re-enter it through the same cavity thus remaining trapped in system 2.

Referring further to FIG. 16, ray 136 strikes one of the contact fingers 24 from its back. In a non-limiting example of crystalline Si photovoltaic cells, the contact fingers can commonly be made by screen-printing onto the front surface using a silver paste which is reflective in a broad spectrum of light.

Ray 136 is subsequently reflected from contact finger 24 back into photovoltaic layer 4 thus also remaining trapped in system 2. Since the specular type of reflection can be more advantageous than the diffuse one in the illustrated case, the specular reflectivity of the front contacts can be enhanced by depositing a mirror-finish silver thin film on surface 32 in the respective areas before screen printing the contact fingers 24.

Figure 17:
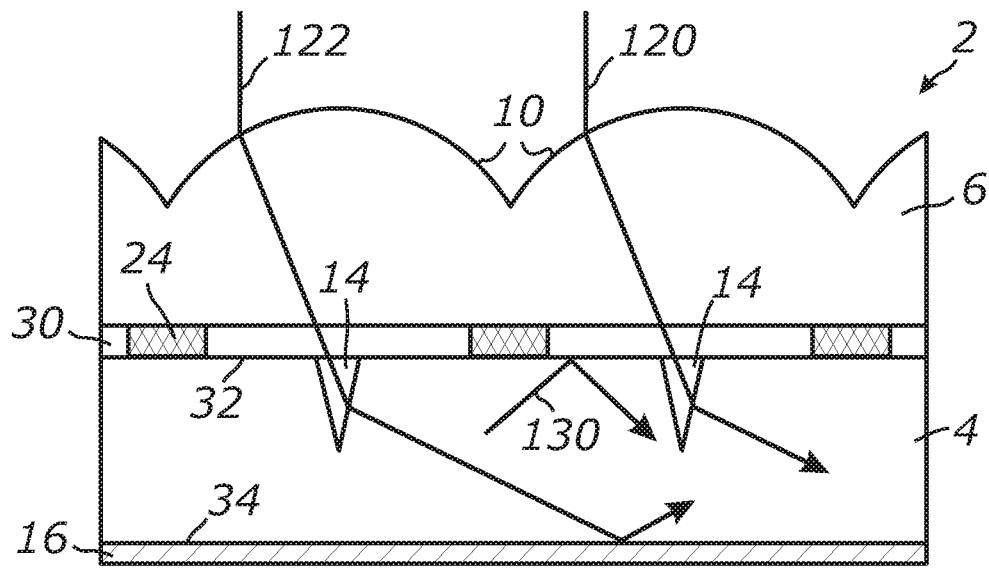
FIG. 17 is a schematic view and ray tracing of a light harvesting system portion further incorporating a layer of transparent material between a focusing array and a photovoltaic layer, according to at least one embodiment of the present invention.

In FIG. 17, a transparent buffer layer 630 is shown provided between focusing array 6 and photovoltaic layer 4. This buffer layer can serve a congruence of goals. It can provide encapsulation for the photovoltaic layer 4 and its contacts from the ambient air and moisture. Layer 630 can also act as an adhesive layer between focusing array 6 and photovoltaic layer 4 and assist in forming a monolithic structure of light harvesting system 2. Additionally, it can serve as low refractive index cladding for photovoltaic layer 4 and promote light trapping by means of TIR.

Referring to FIG. 17, light rays 120 and 122 received and focused by lenses 10 enter photovoltaic layer 4 through the respective light input ports 14 and propagate in photovoltaic layer 4 as in a waveguide by bouncing from surfaces 32 and 34 until absorbed. Similarly to FIG. 16, the reflection of light from surface 32 by means of TIR is illustrated by ray 130 in FIG. 17.

Although the preceding embodiments described light input ports which were formed by individual cavities in surface 32, the present invention can be implemented with each light input port 14 formed by a textured area having multiple surface relief features or microstructural elements that can enhance light coupling into photovoltaic layer 4 and minimize reflection from surface 32. Any suitable surface texture that allows the incident light to pass through surface 32 with a reduced reflection and greater off-normal propagation angles in photovoltaic layer 4 compared to light entrance through the smooth portions of surface 32 can be used for making light input ports 14. By way of example and not limitation, each light input port 14 can include random or ordered arrays of high-aspect-ratio pyramids or inverted pyramids, nano-rods, nano-wires, close positioned microcavities, micro-holes, micro-extensions or bulges, etc.

Figure 18:
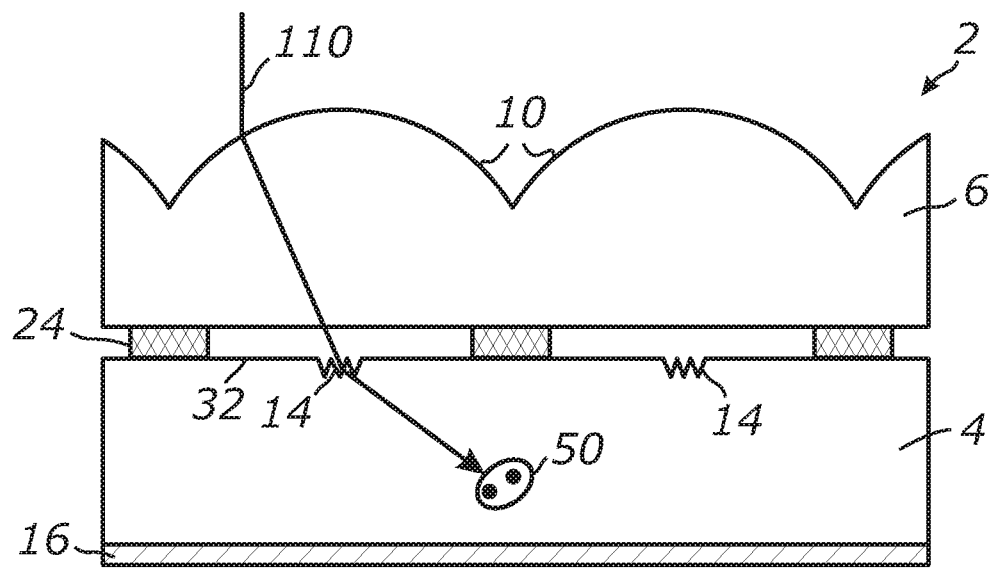
FIG. 18 is a schematic perspective view and raytracing of a light harvesting system portion in which light input ports are formed by textures areas in a photovoltaic layer, according to at least one embodiment of the present invention.

FIG. 18 shows an illustrative example of system 2, where each light input port 14 associated with surface 32 is formed by an array of V-shaped micro cavities or grooves having the sizes substantially smaller than the active aperture of the respective light input port. In operation, ray 110 is focused by lens 10 onto the respective light input port 14 which inject said ray into photovoltaic layer 4 at an oblique angle so that it can be trapped and absorbed between surfaces 32 and 34.

Figure 19:
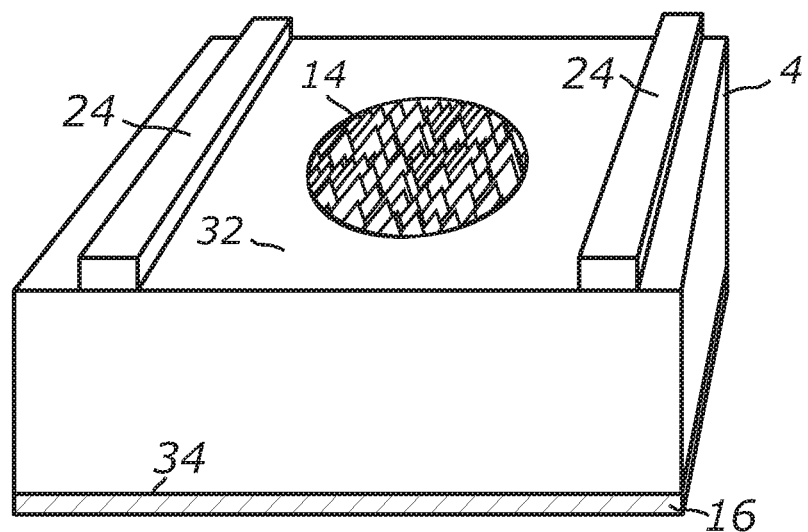
FIG. 19 is a schematic perspective view of a photovoltaic layer portion incorporating a plurality of prismatic surface relief features, according to at least one embodiment of the present invention.

In FIG. 19, a portion of photovoltaic layer 4 is shown where light input port 14 is positioned between contact fingers and is formed by a textured surface area comprising sharp peaks and valleys of random pyramids. This exemplary configuration of light input port 14 also promotes light coupling with reduced surface reflection. The textured area covers only a relatively small portion of surface 32 and therefore does not substantially affect the overall surface smoothness and optical properties.

It will be appreciated that diffusers or a random light scattering microstructure or surface texture can also be used for forming light input ports 14 in which case the light will be more randomly distributed across a range of angles in photovoltaic layer 4. A further example of useful feature 14 can be a matte-finish textured area in surface 32 having the aperture approximating the dimensions of the focal area of the respective lens 10. When light-scattering surface texture is used for forming light input ports 14, a portion of light injected into photovoltaic layer 4 at near-normal angles may escape from the system. However, due to the usually high refractive index of the material of photovoltaic layer 4 and the resulting small TIR escape cone, a substantial portion of the incident light can still be trapped in a manner described above thus resulting in a generally longer optical path of the rays within the photoresponsive layer and improved photocurrent generation. The light injection of incident light into photovoltaic layer 4 at advantageously high angles with respect to the surface can also be provided using diffraction gratings or holograms which can additionally be tuned for a specific spectral band. For example, when the photoresponsive layer of photovoltaic layer 4 comprises crystalline silicon which has reduced absorption in the infrared, light input ports 14 can be tuned to provided greater bend angles for the wavelengths in the range of 800-1100 nanometers.

Although the preceding embodiments described font electrical contact of photovoltaic layer 4 which was configured as metallic contact fingers 24 attached to surface 32, the present invention can be implemented using other types of front and back electrical contacts. By way of example and not limitation, a transparent electro-conducting layer can be attached to surface 32 instead or in addition to contact fingers 24. Such transparent front contact can be made from any conventional transparent conducting material. Particularly, transparent conducting films (TCFs) conventionally used for photovoltaic applications can be employed. TCF can be fabricated from inorganic and/or organic materials. An example of inorganic films is a layer of transparent conducting oxide (TCO). Suitable materials for the TCO include, but are not limited to, aluminum-doped zinc oxide (AZO), boron-doped zinc oxide, fluorine doped tin oxide (FTO), indium tin oxide (ITO), indium molybdenum oxide (IMO), indium zinc oxide (IZO) and tantalum oxide. The TCO layer can be deposited onto surface 32 by any suitable process, such as chemical vapor deposition (CVD) or physical vapor deposition (PVD). The thickness of the transparent electro-conducting layer can be fairly small compared to the thickness of photovoltaic layer 4 and can be typically up to about a few thousand nanometers. Furthermore, back contact 16 can also be implemented as a transparent electro-conducting layer and made as described above.

The foregoing embodiments are described upon the case when back contact 16 is applied to surface 34 and is also used as a reflective surface for trapping the light in photovoltaic layer 4. However, this invention is not limited to this but can also be applied to the case when an intermediate reflective layer is provided between photovoltaic layer 4 and back contact 16 to enhance the internal reflection at surface 34. By way of example and not limitation, the intermediate reflective layer may include a Bragg reflector formed by a stack of alternating porous Si layers of high and low porosity defined by the quarter-wavelength principle. The porous Si layers can be electrochemically etched into a highly doped Si substrate to create constructive interference for the efficient reflection of the incident light for a pre-selected wavelength range and thus enhance the reflectivity of surface 34 and light trapping in photovoltaic layer 4.

The foregoing embodiments are described upon the case when focusing array 6 was configured as an array of imaging lenses. However, this invention is not limited to this but can also be applied to the case when focusing array 6 may comprise any desired optical structures or surface relief features distributed over its frontal surface and adapted for collecting or concentrating the impinging light. Any known light focusing structure which collects the energy from a larger area and focuses it to a smaller focal area can be used to form the individual focusing elements of focusing array 6. By way of example and not limitation, focusing elements of the array can be selected from the group of optical elements consisting essentially of spherical or aspherical refractive lenses, Fresnel lenses, TIR lenses, gradient index lenses, diffraction lenses, lens arrays, mirrors, Fresnel mirrors, mirror arrays, trough mirrors, and the like.

It should be understood that while the preceding embodiments were illustrated by depicting only a few exemplary rays, system 2 can operate with any number of rays within a selected acceptance angle and in a desired spectral range of the incident light. It should also be understood that focusing array 6 can collect a beam of light emanated by a distant source, focus the beam and communicate it to light input ports 14. Accordingly, light input ports 14 can be configured to receive a convergent or divergent beam of focused light having a predetermined angular spread and redirect the beam into photovoltaic layer 4 at a sufficient bend angle so that each ray of the redirected beam becomes trapped in photovoltaic layer 4 and further propagates in it by means transmission and reflection until absorbed. It will be appreciated by those skilled in the art that system 2 can be used to effectively capture a quasi-parallel beam of monochromatic or broad-spectrum electromagnetic energy, trap and guide it through its photovoltaic element or layer so that substantially all of the beam can be absorbed and converted into the electric current using a much thinner layer of photoabsorptive material than in conventional devices.

Furthermore, it should be understood that, as illustrated by foregoing embodiments, the surfaces confining the captured light within photovoltaic layer 4 can be located anywhere within the structure forming system 2 and/or at any of its external edges or faces. They can also be configured to reflect light by means of specular reflection, TIR, or scattering. It should also be understood that photovoltaic layer 4 can be located anywhere between such surfaces so as to provide for the multiple passage of the trapped light through the photoresponsive material of the photovoltaic layer 4 and promote absorption.

The present invention is not limited to the case when focusing array 6 and photovoltaic layer 4 are disposed in a stationary position with respect to each other and can also be applied to the case when focusing array 6 and photovoltaic layer 4 can be disposed in any one of a translated, a reversed and/or a rotated orientation relative to each other in order, for example, to adjust the optical paths of the incident rays or to track the source of light. Furthermore, focusing array 6 and photovoltaic layer 4 can be made movable with respect to each other to adjust the positions of light input ports 14 with respect of the focal areas of respective lenses 10. Furthermore, a tracking device can be provided to facilitate pointing of system 2 to the light source. Single or multiple instances of system 2 can be provided in the form of panels or plates and installed on an individual tracking unit. When system 2 is used to collect sunlight and convert it to electricity, the tracking device may include mechanical, hydraulic, electric and electronic components such as are those well-known in the art. The tracking device can be implemented as a single-axis or two-axis tracker to follow the diurnal motion of the sun and maintain the prevailing plane of system 2 generally perpendicular to the direction to the sun at least in one angular dimension.

It will be appreciated that, in accordance with preferred embodiments, lenses 10 are provided for pre-focusing of at least the direct beam component of the incident light into a number of smaller beams and injecting said beams into photovoltaic layer 4 through a plurality of small designated areas rather than through the entire surface area. Light input ports 14 are provided to facilitate the injection of the focused beams and can also be located anywhere in system 2 provided they are located in the vicinity of the focal areas of the respective lenses 10 and are optically coupled to photovoltaic layer 4. Various examples and configurations of focusing array 6 and light input ports 14 have been described and provided by way of examples and not limitations. Further examples and configurations will become apparent to those skilled in the art without departing from the scope and spirit of this invention.

Further details of operation of system 2 shown in the drawing figures as well as its possible variations will be apparent from the foregoing description of preferred embodiments. Although the description above contains many details, these should not be construed as limiting the scope of the invention but as merely providing illustrations of some of the presently preferred embodiments of this invention. Therefore, it will be appreciated that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the phrase "means for."

What is claimed is:

1. A light converting optical system, comprising:
   a first broad-area reflective surface comprising a plurality of linear light deflecting surface relief structures and configured for reflecting light using a total internal reflection;
   a second broad-area reflective surface extending parallel to and being substantially coextensive with the first broad-area reflective surface;
   a generally planar photoresponsive layer disposed between the first and second broad-area reflective surfaces, the photoresponsive layer comprising quantum dots distributed within an optically transmissive material, wherein at least some of the quantum dots are configured to absorb and convert light selectively such that at least a substantial portion of light in a first spectral range is absorbed and converted and light in a second spectral range is transmitted;

a monochromatic light source configured to emit light in the first spectral range; and a planar array of lenses distributed over an area of the photoresponsive layer and disposed on a light path between the light source and the photoresponsive layer; wherein the surface relief structures are configured to redirect light at a sufficiently high angle away from the original propagation direction, wherein the photoresponsive layer has a thickness that is less than a minimum thickness sufficient for absorbing substantially all received light in a single pass at normal incidence, and wherein the first and second broad-area reflective surfaces form a light trapping structure configured to provide for multiple transverse light passage through the photoresponsive layer.

2. A light converting optical system as recited in claim 1, wherein photons of the second spectral range predominantly have lower energy than those of the first spectral range.

3. A light converting optical system as recited in claim 1, wherein at least some of the quantum dots are configured to generate electron-hole pairs using the energy of the absorbed light.

4. A light converting optical system as recited in claim 1, wherein the monochromatic light source is configured to emit light towards the photoresponsive layer and wherein the planar array of lenses is disposed between the monochromatic light source and the photoresponsive layer.

5. A light converting optical system as recited in claim 1, comprising an optically transmissive substrate sheet, wherein the planar array of lenses comprises a plurality of parallel linear cylindrical lenses formed on the optically transmissive substrate sheet, wherein the linear cylindrical lenses longitudinally extend parallel to each other between two opposite edges of the substrate sheet.

6. A light converting optical system as recited in claim 1, comprising a plurality of parallel linear grooves, wherein the planar array of lenses is formed by a plurality of parallel linear cylindrical lenses formed on an optically transmissive substrate sheet and disposed side by side, wherein each of the cylindrical lenses extends parallel to the plurality of linear grooves between two opposite edges of the substrate sheet.

7. A light converting optical system as recited in claim 1, wherein the planar array of lenses comprises a two-dimensional array of spaced apart round lenses arranged in rows and columns, wherein the row spacing and column spacing is substantially uniform.

8. A light converting optical system as recited in claim 1, wherein the planar array of lenses comprises a two-dimensional regular array of spaced apart round TIR lenses arranged in rows and columns.

9. A light converting optical system as recited in claim 1, wherein each of the lenses comprises a non-imaging TIR lens having a round aperture.

10. A light converting optical system as recited in claim 1, wherein the planar array of lenses comprises a two-dimensional regular array of spaced apart round Fresnel lenses arranged in rows and columns.

11. A light converting optical system as recited in claim 1, wherein each of the lenses is configured to receive a portion of light emitted by the light source and angularly redistribute the received light so as to cause light entrance onto the photoresponsive layer at oblique angles.

12. A light converting optical system as recited in claim 1, wherein the photoresponsive layer is encapsulated using an optically transmissive layer that is impermeable to ambient air and moisture.

13. A light converting optical system as recited in claim 1, further comprising an optically transmissive layer disposed in contact and bonded to the photoresponsive layer, wherein the optically transmissive layer is configured for protecting the photoresponsive layer from ambient air and/or moisture.

14. A light converting optical system as recited in claim 1, wherein the photoresponsive layer comprises random light-scattering surface microstructures or texture.

15. A light converting optical system as recited in claim 1, wherein the photoresponsive layer comprises light scattering elements.

16. A light converting optical system as recited in claim 1, wherein at least some of the quantum dots are configured to generate one or more charge carriers using the energy of the absorbed light.

17. A light converting optical system as recited in claim 1, comprising a light guiding layer configured to receive light at a first location and guide the received light towards a different location using optical transmission and a total internal reflection, wherein a broad-area surface of the light guiding layer comprises a plurality of light deflecting surface relief features having curved walls, and wherein a distance between two adjacent light deflecting surface relief features is greater than the size of each of the two adjacent light deflecting surface relief features.

18. A light converting optical system, comprising:
a first broad-area reflective surface comprising a plurality of linear light deflecting surface relief structures and configured for reflecting light using a total internal reflection;
a second broad-area reflective surface extending parallel to and being substantially coextensive with the first broad-area reflective surface;
a generally planar photoresponsive layer disposed between the first and second broad-area reflective surfaces;
the photoresponsive layer comprising quantum dots embedded into an optically transmissive material and an optically transmissive layer bonded to the photoresponsive layer and configured to protect the quantum dots from ambient air and moisture, wherein at least some of the quantum dots are configured to selectively absorb at least a substantial portion of light in a first spectral range and transmit light in a second spectral range, wherein photons of the second spectral range predominantly have lower energy than those of the first spectral range;
wherein the thickness of the photoresponsive layer is less than a minimum thickness sufficient for absorbing substantially all received light in a single pass at normal incidence;
a monochromatic light source configured to emit light in the first spectral range towards the photoresponsive layer; and
a planar two-dimensional array of non-imaging TIR lenses disposed between the light source and the photoresponsive layer, wherein the lenses are spaced apart from each other and arranged in parallel rows and columns within the array.

19. A light converting optical system, comprising:
a first broad-area reflective surface comprising a plurality of linear light deflecting surface relief structures and configured for reflecting light using a total internal reflection;

a second broad-area reflective surface extending parallel to and being substantially coextensive with the first broad-area reflective surface;

a generally planar photoresponsive layer disposed between the first and second broad-area reflective surfaces;

the photoresponsive layer comprising quantum dots embedded into an optically transmissive material wherein at least some of the quantum dots are configured to selectively absorb at least a substantial portion of light in a first spectral range and transmit light in a second spectral range, wherein photons of the second spectral range predominantly have lower energy than those of the first spectral range;

an optically transmissive layer bonded to the photoresponsive layer and configured to protect the quantum dots from ambient air and moisture;

a monochromatic light source configured to emit light in the first spectral range; and a planar lenticular lens array disposed parallel to and being substantially coextensive with the photoresponsive layer, the lens array comprising an array of parallel linear cylindrical lenses formed on an optically transmissive substrate sheet and longitudinally extending parallel to each other between two opposite edges of the substrate sheet;

wherein each of the linear cylindrical lenses is disposed on a light path between the light source and the photoresponsive layer, and wherein the photoresponsive layer has a thickness that is less than a minimum thickness sufficient for absorbing substantially all received light in a single pass at normal incidence.

20. A method of manufacturing a light converting optical system, comprising the steps of:

providing a first broad-area reflective surface comprising a plurality of linear light deflecting surface relief structures and configured for reflecting light using a total internal reflection;

providing a second broad-area reflective surface extending parallel to and being substantially coextensive with the first broad-area reflective surface;

providing a generally planar photoresponsive layer comprising quantum dots distributed within an optically transmissive material, wherein at least some of the quantum dots are configured to absorb and convert light selectively such that at least a substantial portion of light in a first spectral range is absorbed and converted and light in a second spectral range is transmitted, wherein a thickness of the photoresponsive layer is less than a minimum thickness sufficient for absorbing substantially all light receivable on the photoresponsive layer in a single pass at normal incidence;

positioning the photoresponsive layer between the first and second broad-area reflective surfaces;

providing a monochromatic light source configured to emit light in the first spectral range;

providing a planar array of lenses distributed over a broad area; and disposing the planar array of lenses on a light path between the light source and the photoresponsive layer;

wherein the surface relief structures are configured to redirect light at a sufficiently high angle away from the original propagation direction, wherein the first and second broad-area reflective surfaces form a planar light trapping structure configured to provide for multiple transverse light passage through the photoresponsive layer.

* * * * *